United States Patent [19]
Kelly

[11] Patent Number: 5,366,555
[45] Date of Patent: Nov. 22, 1994

[54] CHEMICAL VAPOR DEPOSITION UNDER A SINGLE REACTOR VESSEL DIVIDED INTO SEPARATE REACTION REGIONS WITH ITS OWN DEPOSITING AND EXHAUSTING MEANS

[76] Inventor: Michael A. Kelly, 35 Lerida Ct., Portola Valley, Calif. 94028

[21] Appl. No.: 69,679

[22] Filed: Jun. 1, 1993

Related U.S. Application Data

[60] Continuation of Ser. No. 753,867, Sep. 3, 1991, abandoned, which is a division of Ser. No. 535,888, Jun. 11, 1990, Pat. No. 5,071,670.

[51] Int. Cl.$^5$ .............................................. C23C 16/00
[52] U.S. Cl. ................................... 118/719; 118/715; 118/723 E; 118/723 MR; 118/723 ME
[58] Field of Search ................ 118/715, 719, 723 E, 118/723 MR, 723 ME

[56] References Cited

U.S. PATENT DOCUMENTS

| | | | |
|---|---|---|---|
| 4,058,430 | 11/1977 | Suntola | 427/255.7 |
| 4,413,022 | 11/1983 | Suntola | 427/255.7 |
| 4,622,919 | 11/1986 | Suzuki et al. | 118/718 |
| 4,664,743 | 5/1987 | Moss | 118/719 |
| 4,767,641 | 8/1988 | Kieser | 118/723 |
| 4,826,585 | 5/1989 | Davis | 118/723 |
| 4,871,581 | 10/1989 | Yamazaki | 118/723 |
| 4,926,791 | 5/1990 | Hirose | 118/723 |
| 4,976,996 | 12/1990 | Monkowski | 118/719 |
| 4,987,856 | 1/1991 | Hey | 118/719 |

FOREIGN PATENT DOCUMENTS

| | | | |
|---|---|---|---|
| 60-60714 | 8/1985 | Japan | . |
| 62-234974 | 11/1985 | Japan | 118/723 |

Primary Examiner—Richard Bueker
Attorney, Agent, or Firm—Janet K. Castaneda; James E. Eakin

[57] ABSTRACT

Apparatus for a sequential continuous vapor deposition process provides a plurality of physically separated process environments in a single reactor vessel. A substrate mounting plate within the reactor vessel movably positions a substrate mounted thereon sequentially between the plurality of separated process environments. Each of the process environments are defined by a gas emitter structure for emitting a predetermined gas from a source thereof to the environment adjacent to the substrate when it is moved into position adjacent thereto and an exhaust structure through which the gas flows from the environment. A substrate positioning structure movably positions the substrate mounting plate so that the substrate is thereby sequentially passed through each one of the process environments. A vacuum pump between the chamber and an external exhaust environment produces a negative pressure within the reactor vessel relative to pressures at the plural gas emitters to maintain physical separation of gases flowing within the plurality of separated process environments.

14 Claims, 4 Drawing Sheets

CHEMICAL VAPOR DEPOSITION UNDER A SINGLE REACTOR VESSEL DIVIDED INTO SEPARATE REACTION REGIONS WITH ITS OWN DEPOSITING AND EXHAUSTING MEANS

REFERENCE TO RELATED APPLICATION

This application is a continuation, of application Ser. No. 07/753,867, filed Sep. 3, 1991, now abandoned, which is a division of Ser. No. 07/535,888, filed Jun. 11, 1990 now U.S. Pat. No. 5,071,670.

FIELD OF THE INVENTION

The present invention relates to apparatus for growing materials on a surface by subjecting that surface to a rapid sequence of different chemical environments within a single reactor vessel wherein the environments are physically separated from each other. The preferred processing environment enables e.g. a multi-step process resulting in growth of a layer of the desired material.

BACKGROUND OF THE INVENTION

Chemical vapor deposition (CVD) is a widely used method for growing materials on surfaces within a gaseous environment. CVD involves exposing some solid surface (substrate) to an environment consisting of gases which react with the substrate to form a desired layer of new material composed in part of the elements present in the gases. In this manner, metals may be deposited on semiconductors, polymeric materials may be deposited on metals, and many other practical coatings or overlayers may be so produced. Often it is also necessary to supply energy in the form of heat or plasma excitation in order to assist the deposition process.

While CVD is widely understood and employed in a myriad of useful applications, it is difficult or impossible to grow some materials by conventional CVD techniques if their formation requires gases that are not compatible with each other. For example, it may not be possible to produce a material which requires both hydrogen and oxygen in the formation process because the hydrogen may combine with the oxygen in the gas so rapidly that the desired reaction may be inhibited.

Also, if forming a layer of a specific material requires several chemical reactions in a specific sequence, a single gas environment may result in undesirable out-of-sequence chemical reactions. One immediately apparent solution to this problem would be to transport the substrate from one CVD chamber to another in order to produce the desired sequence of reactions or to eliminate the undesired competitive reactions. However, unless this can be done very rapidly, unwanted reactions or other changes in the surface may occur during the transit time, and the overall time required to grow the desired thickness of material will be prohibitively long. Similarly, sequentially introducing different gases into a single chamber requires either an unacceptable amount of time or an imperfect exchange, so one gas environment contaminates the next.

U.S. Pat. No. 4,664,743 to Moss et al. describes a sequential film growing method by proposing to transport the substrate between a plurality of physically separated environments, each of which is needed to grow a particular material. With the Moss et al. approach, it is possible to produce layers of different materials by moving the substrate from one environment to the other to enable sequential exposure to at least two gas flows. However, the Moss et al. approach is limited to growing only those materials which are capable of being grown in a single gas environment. Also, Moss et al. make no provision for excitation of the different gas environments.

U.S. Pat. No. 4,622,919 to Suzuki et al. teaches film growth by sequential vapor deposition, not CVD. While Suzuki teaches plural gas environments within a reaction vessel, it is not understood how the Suzuki et al. devices would be able to keep the different gas environments separate within the reactor, and would require very high vacuum conditions in which the atoms suffered few collisions between the source and the substrate.

While diamond films may be grown by conventional CVD techniques using mixtures of hydrogen and methane in an electrical discharge, these conventional techniques have required that the substrate be heated to approximately 800° C. This temperature is too hot to provide useful coatings on most materials because of the resultant thermal damage to the substrate. Thus, one hitherto unsolved need has been for a sequential CVD process for growing diamond coatings at lower process temperatures.

SUMMARY OF THE INVENTION WITH OBJECTS

A general object of the present invention is to provide apparatus including a single reactor vessel and structure for rapidly presenting a sequence of effectively separate gaseous environments to a substrate such that materials or layers may be grown by CVD in a manner which overcomes limitations and drawbacks of the prior art approaches.

A more specific object of the present invention is to provide a sequential CVD apparatus in which otherwise incompatible reactions are made to occur one-at-a-time in effectively physically separate environmental areas of a single reactor vessel.

Another specific object of the present invention is to provide apparatus for growing a single layer of atoms of a new material upon a substrate by a CVD process which rapidly presents a sequence of effectively separate gaseous environments to the substrate.

A further specific object of the present invention is to provide sequential CVD processing equipment which is capable of providing distinct excitation conditions in a plurality of process environments defined within the equipment.

One more specific object of the present invention is to provide a sequential CVD single reactor vessel in which the gases of effectively separate environments defined within the vessel are excited as to cause positively or negatively charged species to preferentially strike the substrate so as to permit more selective reactions to occur.

Yet another specific object of the present invention is to provide sequential CVD apparatus for growing diamond films on substrates at lower process temperatures than heretofore realized.

In accordance with the principles of the present invention a plurality of effectively separate gaseous environments are provided within a single sequential CVD reaction vessel or chamber. The effective separation of the plural environments is maintained by preferential gas flow from plural sources positioned sequentially adjacent to the substrate and through passageways defined by structure adjacent to each source which effectively provides a separate exhaust for each source within the vessel or chamber. One or more chamber outlets collect the spent gases emitted from the sources and exhaust them from the vessel or chamber. A vacuum pump may be provided in the outlet in order to establish a desired pressure differential to cause the spent gases to be collected and emitted from the chamber outlet. The rate of gas flow from each of the sources is made large in comparison to time required for diffusion between the plural sources. While the moving substrate may carry a small amount of gas from a former environment to a successor environment within the vessel due to gas stagnation near its surface, the gas so moved either will be too small to cause problems, or it will be purged by movement through an intermediate purging environment.

Preferably, each effectively separate environment within the reaction vessel may be thermally or electrically excited by the application of direct current, radio frequency or microwave radiation to produce the amount of energy or ionized species appropriate to the desired reaction.

Also, the gases of the separate environments within the vessel may be excited thermally or in such a way as to cause positively or negatively charged species preferentially to strike the substrate. This aspect of the invention is implemented by providing an exciting source which is biased with respect to the substrate in an appropriate manner (positive or negative) and results in the occurrence of more selective reactions.

Further, the substrate mounting plate may be moved by rotational force such that a substrate may be very rapidly, sequentially and repetitively positioned within each of the plurality of process environments, as rapidly as one exposure per second, or faster, if desired.

These and other objects, aspects, advantages and features of the present invention will be more fully understood and appreciated by those skilled in the art upon consideration of the following detailed description of preferred embodiments, presented in conjunction with the accompanying drawings.

DETAILED DESCRIPTION OF PREFERRED EMBODIMENTS

Figure 1A:
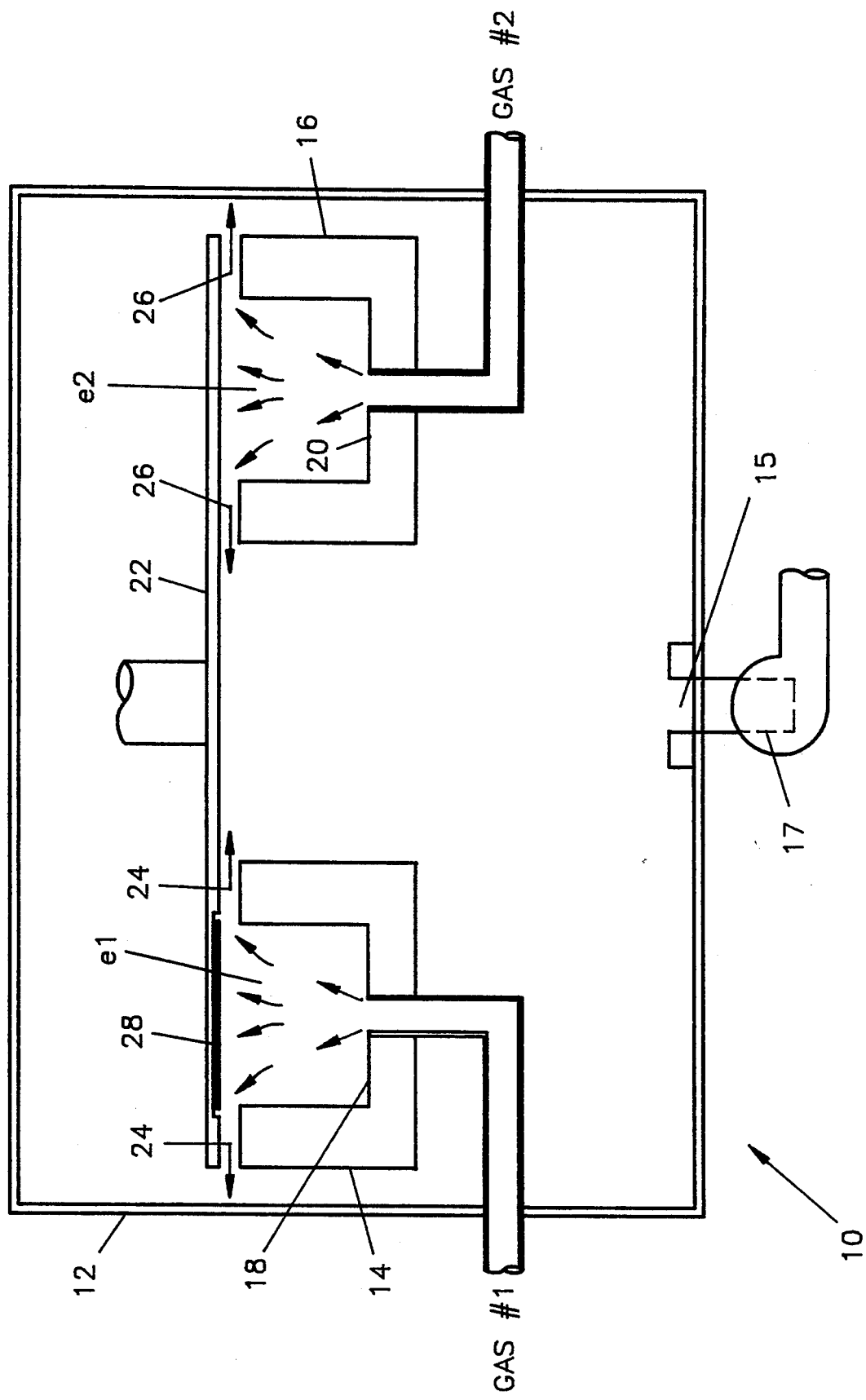
FIG. 1A is a diagrammatic view of a sequential CVD chamber in accordance with the principles of the present invention in which plural gas environments are effectively separated from each other by preferential gas flow within boundaries established by gas emitters and associated gas exhausts.

With reference to FIG. 1, apparatus 10 for sequential. CVD in accordance with the present invention includes a reaction-containing pressure vessel 12 which is evacuated by a vacuum pump 17, to a predetermined desired low pressure level. For example, two gas sources 14 and 16 are contained within the interior of the reactor vessel 12 and direct their respectively different gases upwardly through generally annular, cup-shaped gas emission structures 18 and 20 toward a moving substrate mounting structure 22 which moves a substrate along a parallel locus. The emission structure 18 defines a first process environment e1, whereas the emission structure 20 defines a second process environment e2.

Separation of the environments e1 and e2 is realized by the generally annular and cup-shaped gas emission and directing structures 18 and 20 in association with the substrate mounting plate 22 and resultant peripheral exhaust constrictions 24 and 26. The constrictions 24 and 26 cause spent gases from the emitter structures 18 and 20 to be exhausted into the interior space of the reactor vessel 12, and ultimately from the interior space through a single exhaust 15 and vacuum pump 17 to an exterior spent gas discharge ambient environment (including e.g. gas scrubbing or reclaiming processes as may be required or desired). Gas flow is denoted by the arrows in FIG. 1A.

Gas emitted from the emission structure 18 of the source 14 is exhausted through the exhaust port 24 defined at an outer periphery of the generally cup-shaped structure 18 in relation to the substrate mounting plate 22, and gas emitted from the emission structure 20 of the source 16 is exhausted through the second, similarly configured exhaust port 26. The separate gases leaving the ports 24 and 26 flow into the single reactor vessel 12 and out one or more exhaust gas outlets 15 at which a negative pressure is provided by e.g. the exhaust gas vacuum pump 17.

By making the rate of gas flow from the sources 14 and 16 large compared with time required for intermixture by diffusion of the gases from the sources 14 and 16, the gas environment regions e1 and e2 will have gas compositions almost identical to their respective sources 14 and 16. Hence, if a substrate 28 to be coated is rapidly moved from the environment e1 adjacent to the gas source 14 to the environment e2 adjacent to the gas source 16 by movement of the substrate mounting plate 22 e.g. most preferably in a rotational sense, the substrate 28 will be subjected sequentially to two distinct gaseous environments e1 and e2 within the same vessel 12 and without any solid physical barriers between the two environments e1 and e2. While smooth rotational movement of the substrate 28 between the two environments e1 and e2 is presently preferred, other motions, such as a non-linear or discontinuous step-by-step or "pull-down" motion of the type employed in motion picture film projection, may be provided with slightly greater mechanical complexity to move the substrate 28 to each of the environments e1 and e2.

The substrate 28 moving between the environments will carry a small amount of the gas emitted by the source 14, because of gas stagnation adjacent to the substrate surface. However, in many cases the quantity of gas from the e1 environment will be too small to cause problems. If problems are detected or suspected, a purging environment of inert gas (not shown) may be provided between the sources 14 and 16 to remove the vestiges of the e1 environment gas from the vicinity of the substrate surface.

Figure 2:
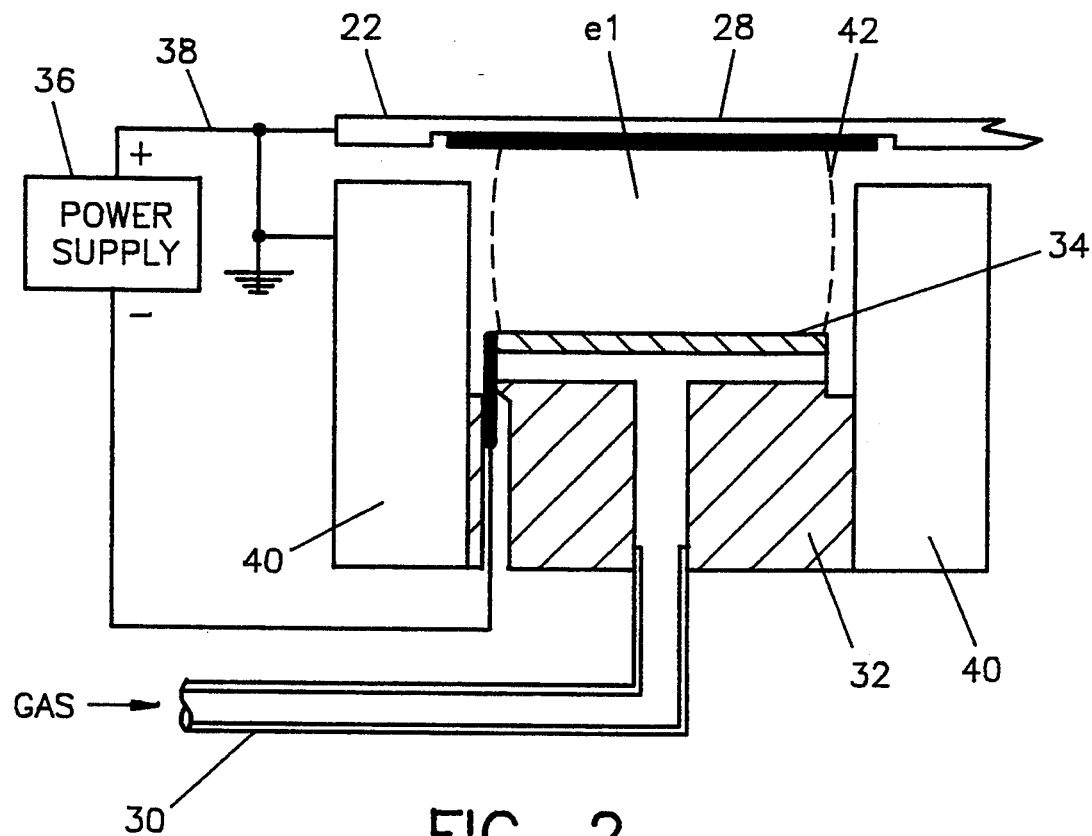
FIG. 2 is a diagrammatic view of a gas source for use within the FIG. 1 CVD chamber which produces and directs negative particles and excited neutral species towards the substrate.

With reference to FIG. 2 the gas source 14 is shown in one preferred form of structural detail. In this preferred embodiment of the gas source 14, negative particles or negatively excited neutral species of deposition material are directed toward the substrate. The source 14 includes a gas conduit 30 for the gas providing the e1 environment which is rich in free electrons and negative ions of the desired element or compound in the gas. The conduit 30 leads through a dielectric insulator structure 32 and through a porous metal electrode 34. The metal electrode 34 is given a negative charge relative to the substrate by virtue of a power supply 36 having its negative lead connected to the porous metal electrode 34 and its positive lead 38 connected to the substrate 28. An anode 40 is also connected to the positive lead 38 and directs the free electrons and negative gas ions toward the substrate. Because of the electric field provided by the power supply 36, a plasma discharge (depicted by the dashed lines in FIG. 2) surrounds the porous metal electrode 34, anode 40 and substrate 28, as denoted by the dashed line in FIG. 2.

As noted above, one aspect of this invention is to provide distinct excitation conditions to each separate gaseous environment. In order to cause desired particular CVD reactions to occur, it is frequently necessary to excite the gas in an electrical discharge to provide energy and create ionic species in the vicinity of the substrate. Accordingly, each environment may be electrically excited by application of direct current as in FIG. 2, or by radio frequency energy or microwave energy in such levels as to produce the amount of excitation energy or ionization appropriate to the desired reaction.

Figure 3:
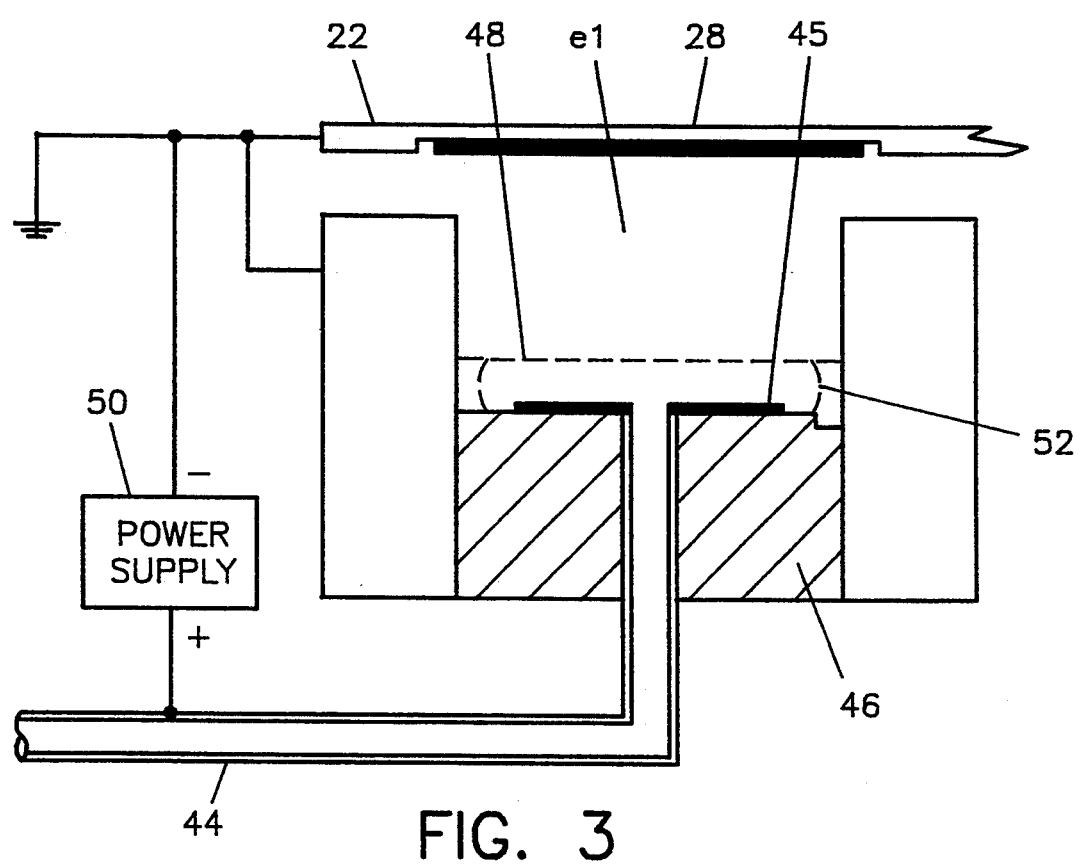
FIG. 3 is a diagrammatic view of a gas source for use within the FIG. 1 CVD chamber which produces and directs positive ions and excited neutral species toward the substrate.

FIG. 3 depicts an embodiment of the gas emitter 16 adapted to produce positive ions or positively excited neutral species. Gas containing desired elements or components needed for the coating being applied to the substrate 28 is delivered through a conduit 44. In this example, the conduit 44 also provides a positive anode and directs the gas through an insulator 46 to an emission site comprising a metal screen 48. A power supply 50 applies a positive bias voltage to the conduit 44 relative to the metal screen 48 and the substrate 28. A plasma discharge 52 results in the space between the anode emitter 44 and the metal screen 48. Positive ions are directed through the screen and toward the substrate 28, thereby creating a desired environment e2, for example. While negative and positive environments e1 and e1 are illustrated, it is to be understood that these are illustrative examples only, and that in practice other environments may be found to be efficacious and developed by following the principles of the present invention.

Figure 4A:
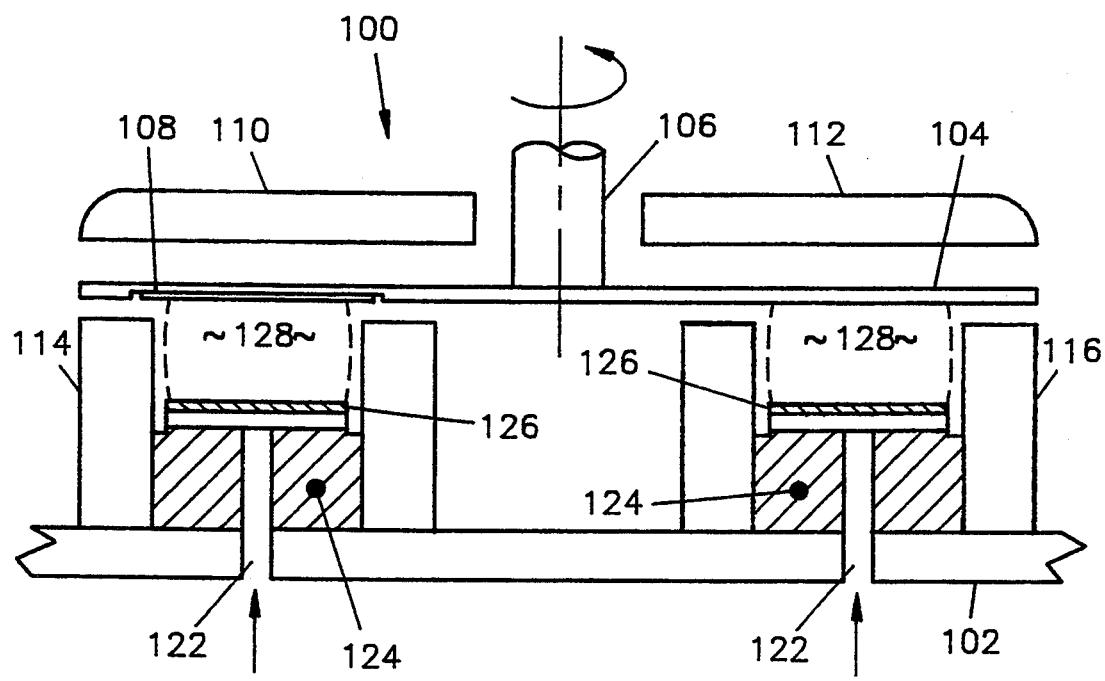
FIG. 4A is a somewhat diagrammatic side view in elevation of one implementation of the FIG. 1 sequential CVD apparatus, showing relative positioning of two of four cathodes within the CVD chamber.

FIG. 4A depicts sequential CVD process apparatus 100 also implementing principles of the present invention. The apparatus 100 includes a pumped pressure vessel 102 (only the base element of which being depicted in FIG. 4A). A rotating substrate plate 104 is rotated by a shaft 106 in a direction depicted by the arrow extending around the shaft. A substrate 108 is mounted to the lower major surface of the plate 104, as perhaps best seen in FIG. 4B. Heater elements 110 and 112 selectively apply heat to the substrate 108 at each one of plural cathode positions as may be required by the particular sequential CVD process.

Figure 4B:
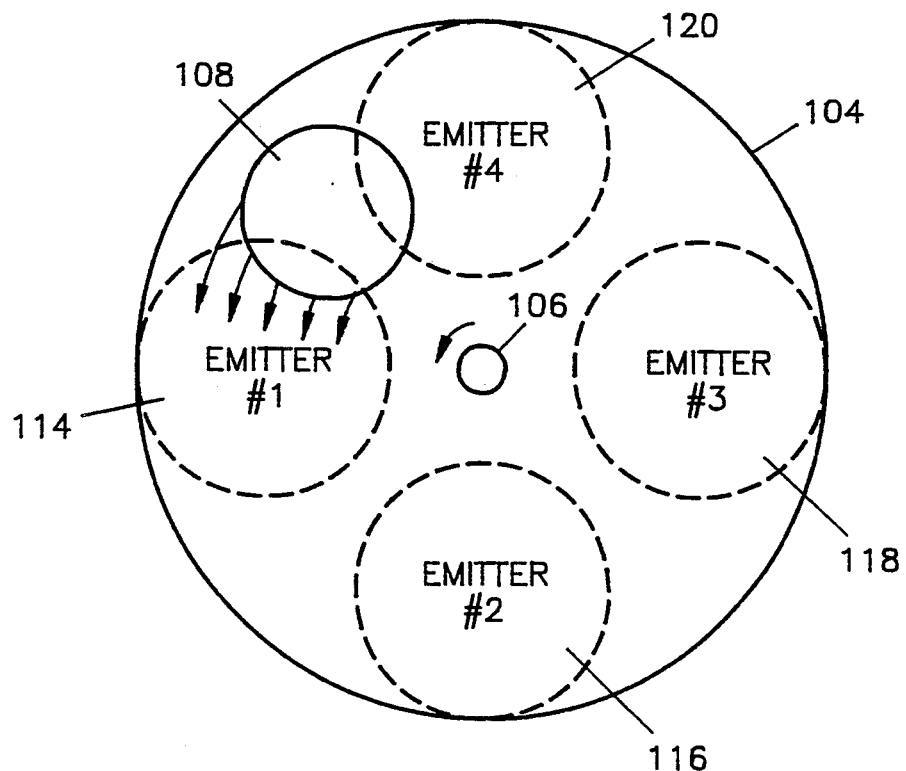
FIG. 4B is a diagrammatic bottom plan view of the substrate wheel of the FIG. 4A apparatus, showing the relative locations of the four cathodes within the chamber to which the substrate is sequentially and repetitively exposed.

Four separate cathode structures 114, 116, 118 and 120 are included in the CVD apparatus 100, as best seen in FIG. 4B. FIG. 4A shows only the first two cathode structures 114 and 116. Each cathode includes a gas conduit 122, insulator 124, electrically negatively biased emitter structure 126 and gas plasma region 128 which includes the substrate 108 when it is in position directly facing the emitter structure 126.

Example for Growing Diamond Films

Diamond films have been grown in a number of low-pressure environments, most notably in a mixture of hydrogen and methane gas at a pressure of 10 to 50 torr in a plasma discharge. Such films are polycrystalline, with faceted crystallites of 0.05 to 1 micron in size which show clear evidence of $sp^3$ bonding by a sharp peak in their raman spectrum at 1332 $cm^1$ characteristic of natural diamond While useful as x-ray windows, wear-resistant coatings, and heat sinks, the number of imperfections in such films make them unsuitable for semiconducting devices, and sub-optimal for optical or mechanical applications. In addition, the high temperatures required for deposition (600°-800° C.) and the lack of clear understanding of adhesion mechanisms preclude their use as coatings on polymers, metals or other semiconductors.

The theoretical understanding of diamond film growth is poor, despite considerable work in this field. The relatively high pressure required for film growth (growth has not been reported for gas pressures lower than one torr) suggests that many body collisions are required in the gas phase to form diamond. Also, the high substrate temperature required suggests that surface diffusion mechanisms play a significant role, or that surface reactions which require a significant amount of activation energy are essential. Theories advanced for the formation of diamond suggest a multiple role for atomic hydrogen: as a passivator of the diamond surface, as a creator of surface vacancies (from energetic atoms), and as a reducer of graphitic carbon that forms during some reactions with the methane. Also, the formation of some precursor such as acetylene in the gas phase has been suggested, but not confirmed. In addition, film properties can be improved considerably by the addition of oxygen-containing compounds, such as $O_2$ or CO. To complicate the theoretical picture further, there are claims of generating diamond films from atomic carbon beams, requiring neither hydrogen nor plasma.

In order significantly to improve diamond film quality or to reduce the substrate temperature required for diamond film growth, a better theoretical understanding of the growth mechanism is highly desirable, and a way to vary independently more of the growth parameters is essential. While there is no unanimity in the literature about an appropriate growth mechanism for diamond films, the following sequence of steps is presently preferred:

a) surface passivation by atomic hydrogen;
b) energetic creation of surface vacancies;
c) attachment of a $CH_3$ radical by a single covalent bond; and, d) formation of two other C—C bonds by reacting hydrogen with oxygen, or by sufficient thermal energy.

Figure 5:
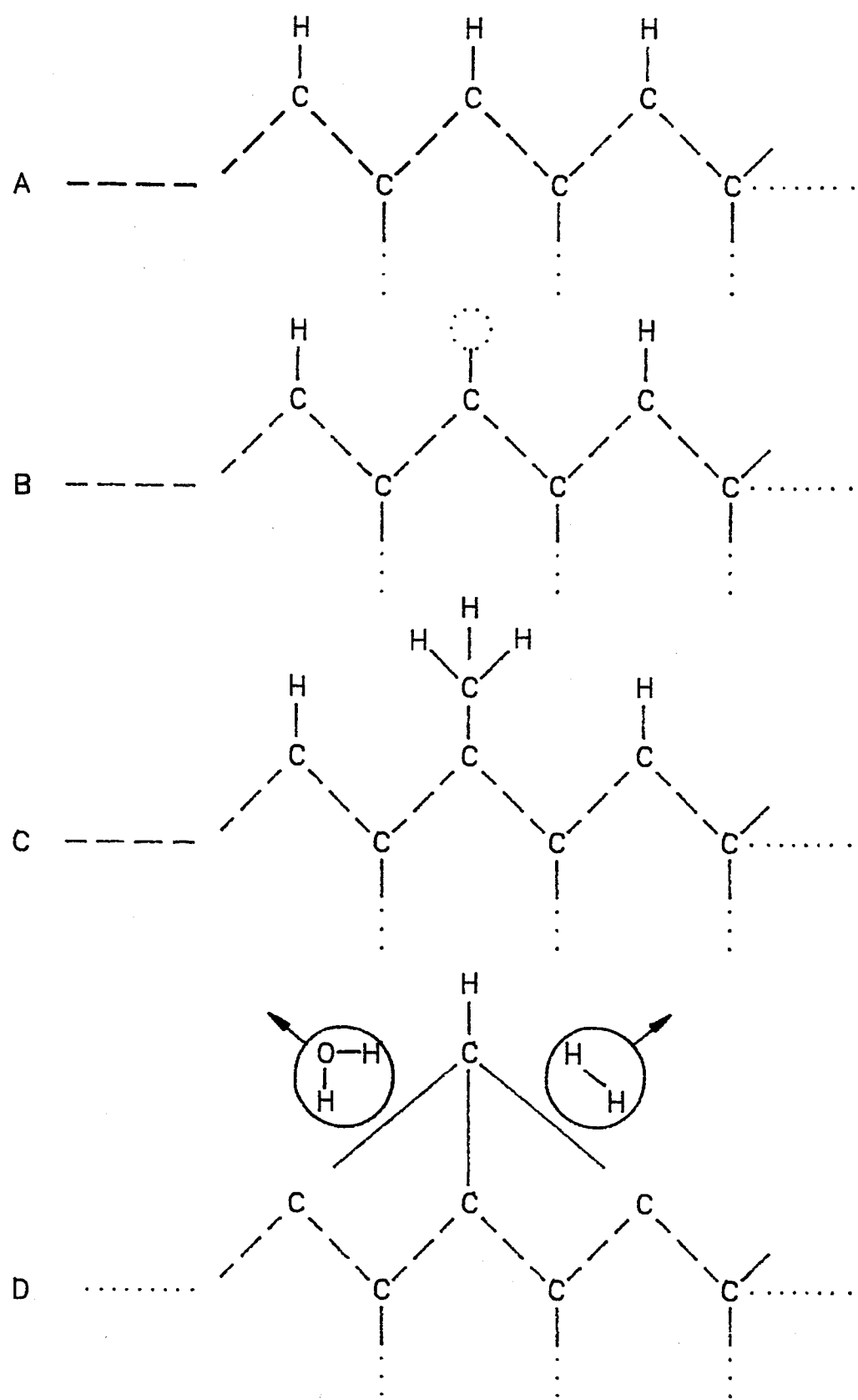
FIG. 5 is a series of four graphs progressively illustrating growth of a diamond film deposition layer of a substrate undergoing sequential continuous vapor deposition processing in accordance with the present invention.

The consequence of the foregoing process is set forth schematically in FIG. 5. Therein, graph A shows surface passivation by atomic hydrogen. All C bonds on the surface of the growing film are terminated by covalently bonded hydrogen atoms.

Graph B shows vacancies being created in the passivation layer by energetic atoms in the plasma discharge directed toward the substrate. Such a vacancy is believed to have a high surface mobility.

Graph C depicts a methyl group, such as $CH_3$, in an excited or ionic state, covalently bonded at the Graph B vacancy.

Graph D depicts the development of two C—C bonds between neighboring carbon atoms which releases the four hydrogen atoms, probably as $2*H_2$ or, if oxygen is involved, as $2H_2O$.

In a conventional reactor, atomic hydrogen is produced by a glow discharge, and is reactive enough to passivate any unsatisfied surface bonds on the diamond surface, as depicted in Graph A. In addition, some of the hydrogen atoms/molecules have enough energy to create transient vacancies, as depicted in Graph B. $CH_3$ and other hydrocarbon species are also produced in the plasma, some of which become covalently attached where a vacancy exists, as graphed in Graph C. By applying enough thermal energy or energetic oxygen atoms, other C—C bonds are formed before the attached methyl group is destroyed, releasing $H_2$ or $H_2O$, as graphed in Graph D. This latter step is the one which is believed to require a high substrate temperature with the conventional process.

By using sequential CVD principles of the present invention, conditions relating to each environment may be controlled separately, so that each step of the above process may be independently optimized. For example, the level of hydrogen excitation required to passivate the surface (step a) can be decoupled from the process supplying energy to create the requisite atomic vacancies (step b). The latter can also be independently optimized by using argon ions or some other non-reactive species. Also, unwanted reactions can be minimized (oxygen needed in step d could be prevented from reacting with the hydrogen of step a, for example).

In the sequential CVD reactor 100 illustrated in FIGS. 4A and 4B, diamond films are grown on metals or semiconducting substrates. The four separate plasma environments provided by the four cathode structures 114,116, 118 and 120. Each cathode emitter 126 is preferably about one inch in diameter. The structures 114,116, 118 and 120 are separately excited by four direct current discharges supplied by power supplies (not shown in FIG. 4).

In the present example of diamond film generation, the four gas sources are respectively 1) hydrogen gas, 2) argon gas, 3) a mixture of methane and argon gases and 4) a mixture of oxygen and argon gases. The latter two mixtures are quite dilute, consisting of at most a few percent oxygen and methane. The total chamber pressure of the vessel 102 is on the order of 0.001 to 0.01 atmospheres, and the gas flow rates are all about 1 to 10 sccm. The four DC power supplies for creating the four plasmas are operated in the 200–500 volt region, and the substrate plate 104 is rotated by a motor (not shown) at a predetermined angular velocity, in this example preferably about several hundred revolutions per minute.

The gases are supplied through small holes in each cathode emitter 126 at a rate high enough to insure that the gas in the plasma region 128 surrounding each cathode is of the desired composition. The substrate 108 to be coated is mounted on the rotating substrate plate 104 above the cathodes 114,116, 118 and 120 at a controllable distance, preferably about 0.5 inches. The plate is radially heated from behind by the heaters 110 and 112 to a desired substrate temperature up to about 1000° C. While the plasmas 128 are presently preferably created by a DC discharge between the cathodes and the anode formed by the plate 104, capacitively coupled RF discharges may also be used to reduce the sputtering of cathode material onto the substrate 108.

Gases flowing through the cathodes are ionized by biasing each one negatively with respect to the common anode provided by the wheel plate 104. Thus, one cathode, such as the cathode 114 delivering hydrogen can be operated at a negative potential of several hundred volts to produce highly excited species, while another cathode with oxygen or methane, such as the cathode 118, can be operated at the anode potential so that little ionization occurs.

At vessel pressures usually employed in diamond growth (10–50 torr), the mean free path in the gas is on the order of a micron, so the cathode dark space and negative glow region will be close to the cathode surface. The positive column of the discharge will extend throughout much of the reset of the chamber, but will be concentrated in the space between the anode (located around the cathodes) and the cathodes. By biasing the substrate to some potential between that of the anode and cathode, the energy of positive or negative species reaching it can be controlled. One can therefore excite species present around each cathode independently and can influence which of these species strikes the substrate 108.

As noted, the substrate plate 104 is rotated at a predetermined rate which is selected to be rapid enough to prevent the previously reacted surface from changing due to contamination or adsorption, typically several hundred RPM. Ideally, the sequence of processes carried out within the reactor 100 will produce one monolayer of diamond film growth upon the substrate 108 for each revolution of the plate 104, giving a diamond film growth rate of about 0.1 micron per minute.

Excited states produced on the substrate surface in one plasma environment will decay many orders of magnitude faster than the transit time from one cathode to another, so one can supply the amount of energy appropriate to the desired reaction at each location.

Several modifications to the apparatus 100 may be made in order to modify its characteristics. For example, since the cathodes 114, 116, 118 and 120 are negatively biased, they will tend not to produce negative ions, except for those formed in the positive column. A different cathode structure, as per FIG. 3, may be substituted for the FIG. 2 structure in order to generate and accelerate negative species or negatively excited neutral species.

Further, because of the short mean-free-path, most atoms and ions reaching the substrate will be of thermal energies. By operating the system at reduced pressures, considerably higher energies can be attained.

Also, particularly if lower pressures are used, it may be desirable to excite the cathodes with RF energy in order to reduce sputtering of the material comprising the cathodes.

To those skilled in the art many variations and widely differing embodiments of the present invention will be suggested by the foregoing description of preferred embodiments. The descriptions and drawings herein are presented by way of example only and should not be construed as limiting the present invention, the scope of which is more particularly pointed out by the following claims.

What is claimed is:

1. Apparatus for a sequential continuous vapor deposition process in a plurality of physically separated process environments defined within the apparatus, the apparatus comprising:

single reactor vessel means for enclosing the process within an interior space thereof at a predetermined environmental pressure, substrate mounting means in the interior space for movably positioning a substrate means mounted thereon sequentially through the plurality of separated process environments, each separated process environment comprising:

gas emission and directing means in the interior space for continuously emitting a predetermined gas from a separate source thereof into the separate process environment, the continuously emitted gas emitted adjacent to the substrate means when the substrate means is moved into the process environment, the gas emission and directing means emitting the gas at a rate sufficient to prevent diffusion of gas from the interior space into said process environment, gas exhaust means structurally located to surround the separate process environment, for continuously exhausting substantially all of the gas emitted by the gas emission and directing means from the separate process environment across a pressure differential into the interior space, the pressure differential sufficient to prevent intermixture of gases by diffusion of gases from the interior space, and evacuation means communicating with the single reactor vessel means for exhausting gas from the interior space to maintain the interior space at the predetermined environmental pressure.

2. The apparatus set forth in claim 1 wherein the gas emission and directing means and the substrate mounting means cooperatively define gas discharge means at a peripheral region of each said gas emission means for discharging the gas emitted by the said gas emission means into an ambient within the single reactor vessel means.

3. The apparatus set forth in claim 2 wherein each said gas emission and directing means comprises a generally annular, cup-shaped structure and wherein said gas exhaust means is defined as a generally annular peripheral gap by the gas emission and directing means and by the substrate mounting means.

4. The apparatus set forth in claim 1 wherein the substrate mounting means comprises a rotary plate, and wherein the means for movably positioning the substrate mounting means comprises a rotary shaft for rotating the rotary plate.

5. The apparatus set forth in claim 4 further comprising rotating means for rotating the rotary shaft.

6. The apparatus set forth in claim 5 wherein the rotating means rotates the rotary shaft at a predetermined average angular velocity such that the substrate means is exposed to each said gas emission means at a repetition rate of at least one exposure per second.

7. The apparatus set forth in claim 1 wherein at least one of said gas emission and directing means comprises an electrically negatively biased electrode means for causing a plasma between the gas emission and directing means and the substrate means as it passes by.

8. The apparatus set forth in claim 1 wherein at least one of the said gas emission and directing means comprises an electrically positively biased electrode means for causing a plasma to be generated at the gas emission and directing means for causing at least one of positively excited ions and excited neutral species to be accelerated toward the substrate means as it passes by.

9. The apparatus set forth in claim 1 wherein said gas emission and directing means comprise a plurality of biased cathode gas emitters at spaced apart locations within the reactor vessel means for creating plasmas through which the substrate means passes as it moves within the reactor vessel means.

10. The apparatus set forth in claim 1 wherein at least one of said gas emission and directing means comprises radio frequency excitation means for exciting the gas emitted thereby by radio frequency radiation.

11. The apparatus set forth in claim 1 wherein at least one of said gas emission and directing means comprises microwave energy excitation means for exciting the gas emitted thereby by microwave radiation.

12. The apparatus set forth in claim 1 wherein at least one of said gas emission and directing means includes heating means for heating a surface thereof for thermally exciting the gas emitted and directed thereby.

13. The apparatus set forth in claim 1 further comprising heating means for generating and applying heat to said substrate means within at least one of said separated process environments.

14. The apparatus set forth in claim 4 wherein there are at least four gas emission and directing means defining four separated process environments.

* * * * *